United States Patent
Turturro

[19]

[11] Patent Number: 5,889,652
[45] Date of Patent: *Mar. 30, 1999

[54] C4-GT STAND OFF RIGID FLEX INTERPOSER

[75] Inventor: Gregory Turturro, Chandler, Ariz.

[73] Assignee: Intel Corporation, Santa Clara, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 837,596

[22] Filed: Apr. 21, 1997

[51] Int. Cl.$^6$ ............................................. H05K 7/20
[52] U.S. Cl. ..................... 361/705; 257/713; 361/719; 361/789
[58] Field of Search ........................... 62/259.2; 257/706, 257/707, 713, 718, 719, 727; 165/80.3, 185, 104.33; 174/16.3, 15.2; 361/699, 700, 704, 705, 717–719, 720–722, 789, 784, 785, 749

[56] References Cited

U.S. PATENT DOCUMENTS

| | | | |
|---|---|---|---|
| 3,626,252 | 12/1971 | Cath | 361/705 |
| 5,311,060 | 5/1994 | Rostoker | 361/714 |
| 5,467,251 | 11/1995 | Katchmar | 361/705 |
| 5,532,906 | 7/1996 | Hanari . | |
| 5,550,406 | 8/1996 | McCormick | 257/666 |
| 5,572,407 | 11/1996 | Sobhani | 361/719 |
| 5,586,010 | 12/1996 | Mortuza . | |
| 5,672,548 | 9/1997 | Culnane | 437/209 |
| 5,706,171 | 1/1998 | Edwards | 361/705 |
| 5,744,863 | 4/1998 | Culnane | 361/705 |

*Primary Examiner*—Gerald Tolin
*Attorney, Agent, or Firm*—Blakely, Sokoloff, Taylor & Zafman LLP

[57] ABSTRACT

An integrated circuit package that contains an integrated circuit that is mounted to a bond portion of a substrate. The bond portion of the substrate is separated from a contact portion of the substrate by a flexible portion. The contact portion is attached to a printed circuit board by a plurality of solder joints. The flexible portion decouples the bond portion from the contact portion to allow relative movement between the package and the circuit board to minimize the strain on the solder joints. The package may also contain a spacer that separates a heat pipe from the integrated circuit and controls the thickness of a thermal grease located between the circuit and the pipe.

11 Claims, 1 Drawing Sheet

C4-GT STAND OFF RIGID FLEX INTERPOSER

BACKGROUND OF THE INVENTION

1. Field of the Invention

The present invention relates to an integrated circuit package.

2. Description of Related Art

As shown in FIG. 1, an integrated circuit 1 is typically assembled into a package 2 that is soldered to a printed circuit board 3. The package 2 is attached to the board 3 by a plurality of solder joints 4. The integrated circuit package 2 and printed circuit board 3 are typically utilized in an environment which has a varying ambient temperature. A variation in the integrated circuit package temperature will create a different thermal expansion rate between the integrated circuit package 2 and the printed circuit board 3.

The integrated circuit 1 and package 2 have a composite coefficient of thermal expansion (CTE) that is different than the coefficient of expansion of the circuit board 3. Consequently, the package 2 undergoes a different rate of thermal expansion than the circuit board as indicated in phantom on the drawing. This difference in expansion rate produces a strain in the solder joints. When cycled over time it has been found that the mechanical strain may crack the solder joint(s) and create an electrical open between the package 2 and the board 3. It would be desirable to provide an integrated circuit package that compensates for the different CTEs of the package and a printed circuit board to minimize the strain on the solder joints.

Some integrated circuits generate a relatively large amount of heat that must be removed from the package. To minimize the circuit junction temperatures there have been incorporated into the packages various heat conductive members that increase the heat transfer rate from the integrated circuit and the package. The heat conductive member may be a heat pipe that is clamped to the integrated circuit. The clamping force of the heat pipe may create localized stresses that crack and damage the integrated circuit. It would be desirable to have an integrated circuit package that can effectively couple a heat conductive member to an integrated circuit while providing an efficient thermal path between the two devices.

SUMMARY OF THE INVENTION

The present invention is an integrated circuit package that contains an integrated circuit that is mounted to a bond portion of a substrate. The bond portion of the substrate is separated from a contact portion of the substrate by a flexible portion.

DETAILED DESCRIPTION OF THE INVENTION

The present invention is an integrated circuit package that contains an integrated circuit which is mounted to a bond portion of a substrate. The bond portion of the substrate is separated from a contact portion of the substrate by a flexible portion. The contact portion is attached to a printed circuit board by a plurality of solder joints. The flexible portion decouples the bond portion from the contact portion to allow relative movement between the package and the circuit board. The relative movement minimizes the strain on the solder joints when the assembly undergoes thermal expansion, or is subjected to external shock and vibration loads. The package may also contain a spacer that separates a heat pipe from the integrated circuit and controls the thickness of a thermal grease located between the circuit and the pipe. The spacer more uniformly distributes the clamping force of the heat pipe on the integrated circuit.

Figure 1:
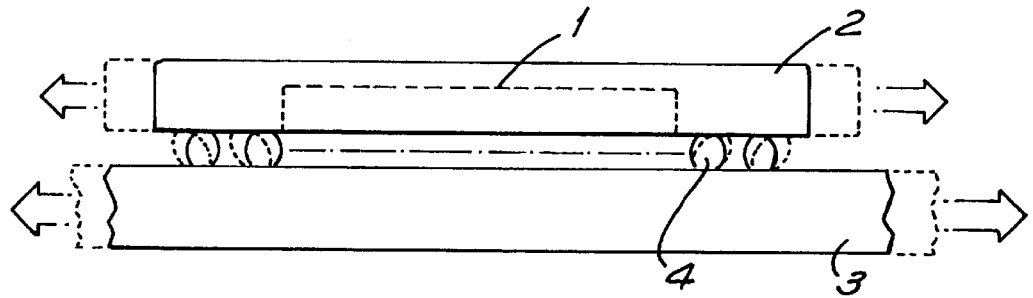
FIG. 1 is a cross-sectional view of an electronic assembly of the prior art.
Figure 2:
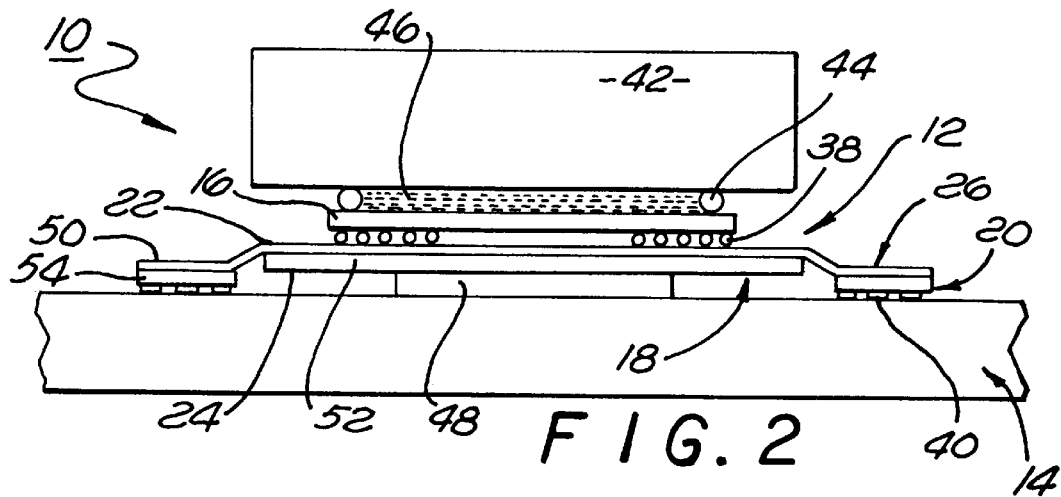
FIG. 2 is a cross-sectional view of an electronic assembly of the present invention.

Referring to the drawings more particularly by reference numbers, FIG. 2 shows an electronic assembly 10 of the present invention. The assembly 10 includes an integrated circuit package 12 that is mounted to a printed circuit board 14. The integrated circuit package 12 includes an integrated circuit 16 that is mounted to a bond portion 18 of a substrate 20. The substrate 20 has a first side 22 and an opposite second side 24. The integrated circuit 16 may be a microprocessor, although it is to be understood that the package 12 may contain any electrical device.

Figure 3:
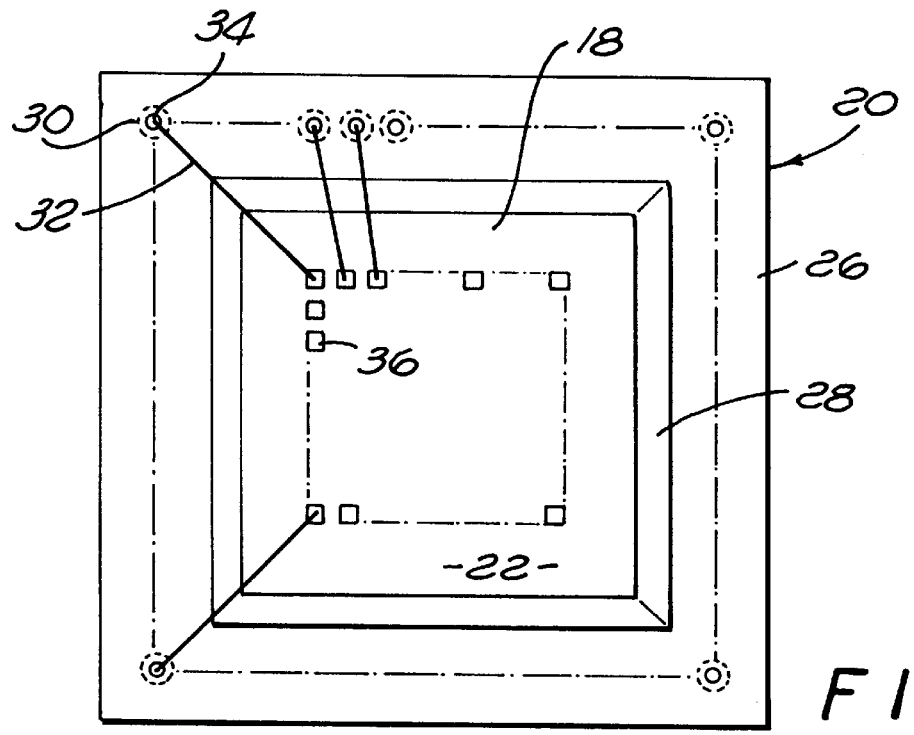
FIG. 3 is a top view of a substrate of the package.

As shown in FIG. 3, the substrate 20 has a contact portion 26 that is separated from the bond portion 18 by a flexible portion 28. The contact portion 26 has a plurality of contact pads 30 that are located on the second side 24 of the substrate 20. The contact pads 30 are connected to a plurality of conductive traces 32 by a plurality of vias 34 that extend through the substrate 20. The conductive traces 32 are routed to a plurality of bond pads 36 located in the bond portion 18 of the substrate 20.

Referring to FIG. 2, the integrated circuit 16 may be mounted to the substrate 20 by solder bumps 38 that are attached to the bond pads 36 with a process commonly referred to as C4 or "flip chip". Although it is to be understood that the integrated circuit 16 can be mounted to the substrate 20 by other means such as wire bonds, or tape automated bonding (TAB). The substrate 20 is mounted to the printed circuit board 14 by solder joints 40 that attach the contact pads 30 to corresponding surface pads (not shown) of the circuit board 14.

When the temperature of the assembly varies, the package 12 and the circuit board 14 undergo a thermal expansion. The package 12 and board 14 have different coefficients of thermal expansion which produce different expansion rates. The flexible portion 28 mechanically decouples the contact portion 26 from the bond portion 18 so that the integrated circuit 16 and connected bond portion 18 can move relative to the circuit board 14 and connected contact portion 26. The relative movement minimizes the strain and corresponding stress on the solder joints 40 and solder bumps 38.

The package 12 may also have a heat conductive member 42 that is coupled to the integrated circuit 16. The heat conductive member 42 may be a heat pipe, heat sink, heat slug, etc., which efficiently removes heat generated by the integrated circuit 16. The heat conductive member 42 is clamped onto the integrated circuit 16 by a clamp (not shown).

The heat conductive member 42 is separated from the integrated circuit 16 by a spacer 44. The spacer 44 may be an O-ring or a pair of plastic pieces that are flexible enough to conform to irregularities in the surfaces of the devices 16 and 42 and more uniformly distribute the clamping force from the member 42 to the circuit 16.

A thermally conductive material such as a thermal grease or a thermal epoxy 46 may fill the space between the integrated circuit 16 and the conductive member 42. The thermal grease or epoxy provides a thermal path of relatively low impedance between the two devices 16 and 42. The spacer 44 also provides a means to accurately control the thickness of the thermal grease or epoxy 46.

An elastomer 48 may be located between the bond portion 18 of the substrate 20 and the printed circuit board 14. The elastomer 48 supports the bond portion 18 and compensates for tolerances between the package 12 and the clamp of the heat conductive member 42. The elastomer 48 may be conductive to provide an electrical path between the substrate 20 and the printed circuit board 14.

The package 12 may be assembled by initially building the substrate 20. The substrate 20 may include a top layer of flexible material 50 that is attached to a pair of rigid substrates 52 and 54 that define the bond 18 and contact 26 portions, respectively. The flexible material 50 may be a polyimide material commonly sold under the trademark KAPTON which has the bond pads 36 and conductive traces 32 formed on a surface of the polyimide. The rigid substrate 54 for the contact portion may have the contact pads 30 formed on a surface of the substrate 54. The flexible polyimide 50 may be bonded to the rigid substrates 52 and 54 with conventional autoclave processes. The vias 34 may then be formed to connect the traces 32 to the contact pads 30.

The integrated circuit 16 may be mounted to the substrate 20 with conventional C4 processes. Solder balls may be attached to the contact pads 30 and then mounted onto the corresponding surface pads of the printed circuit board 14. Alternatively, a solder paste may be screened onto the contact pads 30 or printed circuit board 14. The elastomer 48 is placed onto the printed circuit board 14 before the package 12 is mounted to the board 14. The solder is heated and reflowed to create the solder joints 40 that attach the substrate 20 to the board 14. The solder can be reflowed with an induction bar (not shown) that is placed onto the contact portion 26 of the substrate 20.

The spacer 44 is placed onto the integrated circuit 16 so that there is a cavity on top of the circuit 16. The thermal grease or epoxy 46 is then dispensed onto the integrated circuit 16 to fill the cavity. The heat conductive member 42 can then be clamped onto the spacer 44 to complete the electronic assembly 10. It is to be understood that the order of the process steps may be varied. For example, the thermal grease or epoxy 46 may be applied after the substrate 20 is attached to the printed circuit board 14.

What is thus provided is an integrated circuit package that allows relative movement between the package and an attached printed circuit board, and provides a means to mechanically connect a heat conductive member while controlling a thickness of a thermal grease or epoxy.

What is claimed is:

1. An integrated circuit package, comprising:
    a flexible circuit board which has a bond portion and a contact portion;
    a center substrate that is attached to said bond portion of said flexible circuit board;
    an end substrate that is attached to said contact portion of said flexible circuit board; and,
    an integrated circuit that is mounted to said bond portion of said flexible circuit board.

2. The package as recited in claim 1, wherein said contact portion has a plurality of contact pads.

3. The package as recited in claim 1, wherein said integrated circuit is mounted to said bond portion by a plurality of solder bumps.

4. The package as recited in claim 1, further comprising a heat pipe that is coupled to said integrated circuit.

5. The package as recited in claim 4, further comprising a spacer that separates said heat pipe from said integrated circuit.

6. The package as recited in claim 5, further comprising a thermal grease located between said integrated circuit and said heat pipe.

7. The package as recited in claim 1, further comprising a printed circuit board that is attached to said end substrate and an elastomer located between said center substrate and said printed circuit board.

8. An electronic assembly, comprising:
    a substrate that has a rigid bond portion that is separated from a rigid contact portion by a flexible portion of said substrate;
    an integrated circuit that is mounted to said rigid bond portion of said substrate;
    a heat conductive member that is coupled to said integrated circuit;
    a spacer that separates said heat conductive member from said integrated circuit;
    a printed circuit board that is attached to said contact portion of said substrate;
    an elastomer that separates said bond portion of said substrate from said printed circuit board.

9. The assembly as recited in claim 8, wherein said rigid contact portion has a plurality of contact pads.

10. The assembly as recited in claim 8, wherein said integrated circuit is mounted to said bond portion by a plurality of solder bumps.

11. The assembly as recited in claim 10, wherein said heat conductive member is a heat pipe.

* * * * *